(12) United States Patent
Sugiura et al.

(10) Patent No.: US 9,983,067 B2
(45) Date of Patent: May 29, 2018

(54) OVERHEAT DETECTION CIRCUIT AND SEMICONDUCTOR DEVICE

(71) Applicant: Seiko Instruments Inc., Chiba-shi, Chiba (JP)

(72) Inventors: Masakazu Sugiura, Chiba (JP); Tsutomu Tomioka, Chiba (JP); Hideyuki Sawai, Chiba (JP); Atsushi Igarashi, Chiba (JP); Nao Otsuka, Chiba (JP); Daisuke Okano, Chiba (JP)

(73) Assignee: ABLIC INC., Chiba (JP)

( * ) Notice: Subject to any disclaimer, the term of this patent is extended or adjusted under 35 U.S.C. 154(b) by 450 days.

(21) Appl. No.: 14/692,883

(22) Filed: Apr. 22, 2015

(65) Prior Publication Data
US 2015/0308902 A1    Oct. 29, 2015

(30) Foreign Application Priority Data
Apr. 24, 2014    (JP) ................. 2014-090618

(51) Int. Cl.
*G01K 7/01*  (2006.01)
*G01K 3/00*  (2006.01)
*H01L 27/02* (2006.01)

(52) U.S. Cl.
CPC ............ *G01K 7/01* (2013.01); *G01K 3/005* (2013.01); *H01L 27/0255* (2013.01)

(58) Field of Classification Search
None
See application file for complete search history.

(56) References Cited

U.S. PATENT DOCUMENTS

| 7,880,528 B2 * | 2/2011 | Igarashi | ................. | G01K 7/01 327/512 |
| 7,956,366 B2 * | 6/2011 | Hiroyama | ............ | G02B 6/0073 257/84 |
| 7,977,999 B2 * | 7/2011 | Igarashi | ................. | G01K 3/005 327/512 |

FOREIGN PATENT DOCUMENTS

JP    6-242176 A    9/1994

* cited by examiner

*Primary Examiner* — An Do
*Assistant Examiner* — Renee I Wilson
(74) *Attorney, Agent, or Firm* — Brinks Gilson & Lione

(57) ABSTRACT

Provided is an overheat detection circuit configured to accurately detect a temperature of a semiconductor device even at high temperature and thus avoid outputting an erroneous detection result. The overheat detection circuit includes: a PN junction element, being a temperature sensitive element; a constant current circuit configured to supply the PN junction element with a bias current; a comparator configured to compare a voltage generated at the PN junction element and a reference voltage; a second PN junction element configured to cause a leakage current to flow through a reference voltage circuit at high temperature; and a third PN junction element configured to bypass a leakage current of the constant current circuit at the high temperature.

4 Claims, 3 Drawing Sheets

OVERHEAT DETECTION CIRCUIT AND SEMICONDUCTOR DEVICE

RELATED APPLICATIONS

This application claims priority under 35 U.S.C. § 119 to Japanese Patent Application No. 2014-090618 filed on Apr. 24, 2014, the entire contents of which is hereby incorporated by reference.

BACKGROUND OF THE INVENTION

1. Field of the Invention

The present invention relates to an overheat detection circuit configured to detect an abnormal temperature of a semiconductor device.

2. Description of the Related Art

A circuit disclosed in Japanese Patent Application Laid-open No. Hei 6-242176 has been known as a related-art overheat detection circuit.

FIG. 3 is a circuit diagram of the related-art overheat detection circuit. The related-art overheat detection circuit includes a reference voltage section 10, a temperature sensor 20, and a comparator 30. The related-art overheat detection circuit controls the comparator 30 to compare and determine a voltage generated at a PN junction element 21, being a temperature sensitive element, and a reference voltage Vref output from a reference voltage circuit 11, to thereby detect an overheated state. The voltage generated at the PN junction element 21 basically exhibits negative temperature characteristics as long as the PN junction element 21 is biased by a constant current of the constant current circuit 22. When an ambient temperature increases and the voltage generated at the PN junction element 21 falls below the reference voltage Vref, the comparator 30 outputs a signal indicating the overheated state.

However, in the above-mentioned overheat detection circuit, for example, in a case where the constant current circuit 22 includes a current mirror circuit formed of PMOS transistors, a leakage current between a drain terminal of the PMOS transistor and a substrate is increased when the temperature becomes higher, which leads to an increase in constant current biasing the PN junction element 21. Therefore, there is a problem in that the voltage of the PN junction element 21 is increased and the temperature can thus not be accurately detected.

Moreover, for example, in a case where the reference voltage circuit 11 includes a saturation-connected NMOS transistor, a leakage current between a drain terminal of the NMOS transistor and a substrate is increased when the temperature becomes higher, which leads to a decrease in reference voltage Vref of the reference voltage circuit 11. Consequently, there is a problem in that a reference of the comparator 30 varies and the temperature can thus not be accurately detected.

Moreover, for example, a leakage current of a transistor forming the comparator 30 is increased to adversely affect an internal operating point, which leads to a problem in that neither of the detection of the temperature nor the output of the detection result can be accurately performed.

SUMMARY OF THE INVENTION

The present invention has been made in order to solve the above-mentioned problems, and provides an overheat detection circuit configured to accurately detect a temperature of a semiconductor device even at high temperature and thus avoid outputting an erroneous detection result.

In order to solve the related-art problems, an overheat detection circuit according to one embodiment of the present invention is configured as follows.

The overheat detection circuit includes: a PN junction element, being a temperature sensitive element; a constant current circuit configured to supply the PN junction element with a bias current; a comparator configured to compare a voltage generated at the PN junction element and a reference voltage; a second PN junction element configured to cause a leakage current to flow through a reference voltage circuit at high temperature; and a third PN junction element configured to bypass a leakage current of the constant current circuit at the high temperature.

The overheat detection circuit according to the one embodiment of the present invention can accurately detect the temperature of the semiconductor device even at high temperature and thus output the accurate detection result.

DETAILED DESCRIPTION OF THE PREFERRED EMBODIMENTS

Now, an embodiment of the present invention is described with reference to the drawings.

Figure 1:
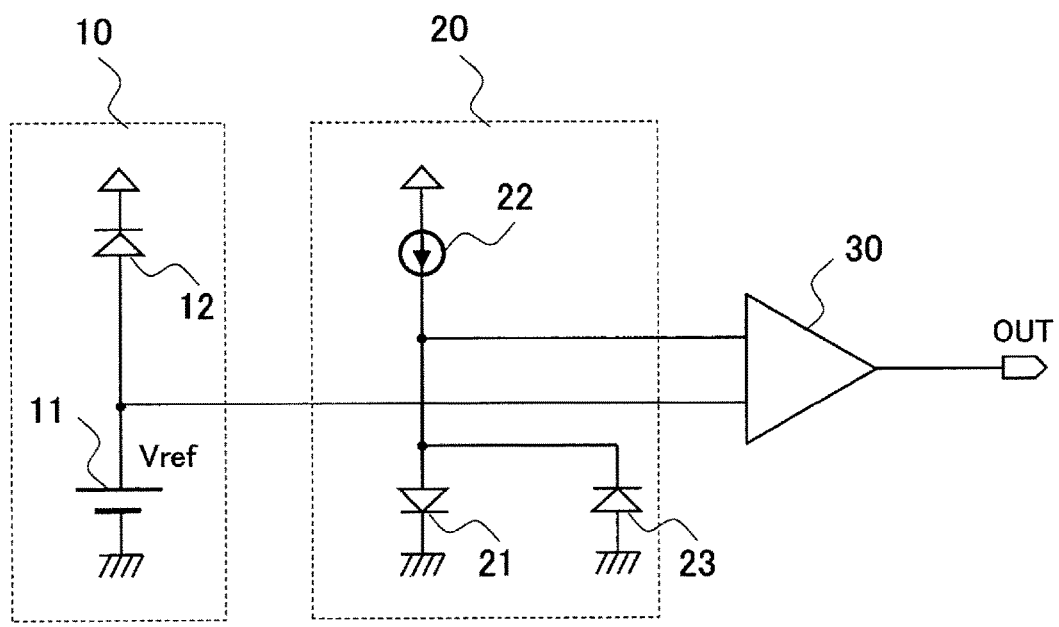
FIG. 1 is a circuit diagram of an overheat detection circuit according to an embodiment of the present invention.

FIG. 1 is a circuit diagram of an overheat detection circuit according to this embodiment.

The overheat detection circuit of this embodiment includes a reference voltage section 10, a temperature sensor 20, and a comparator 30. The reference voltage section 10 includes a reference voltage circuit 11 and a PN junction element 12. The temperature sensor 20 includes a PN junction element 21, a constant current circuit 22, and a PN junction element 23. The PN junction element 21 is a temperature sensitive element. The PN junction element 12 and the PN junction element 23 are elements configured to adjust a leakage current at high temperature.

The PN junction element 12 and the reference voltage circuit 11 are connected in series between a power supply terminal and a ground terminal, and a reference voltage Vref is output from a node therebetween. The constant current circuit 22 and the PN junction element 21 are connected in series between the power supply terminal and the ground terminal, and a voltage Vpn corresponding to temperature is output from a node therebetween. The PN junction element 21 is biased by a constant current of the constant current circuit 22. The PN junction element 23 is connected between the ground terminal and the node of the constant current circuit 22 and the PN junction element 21.

Figure 2:
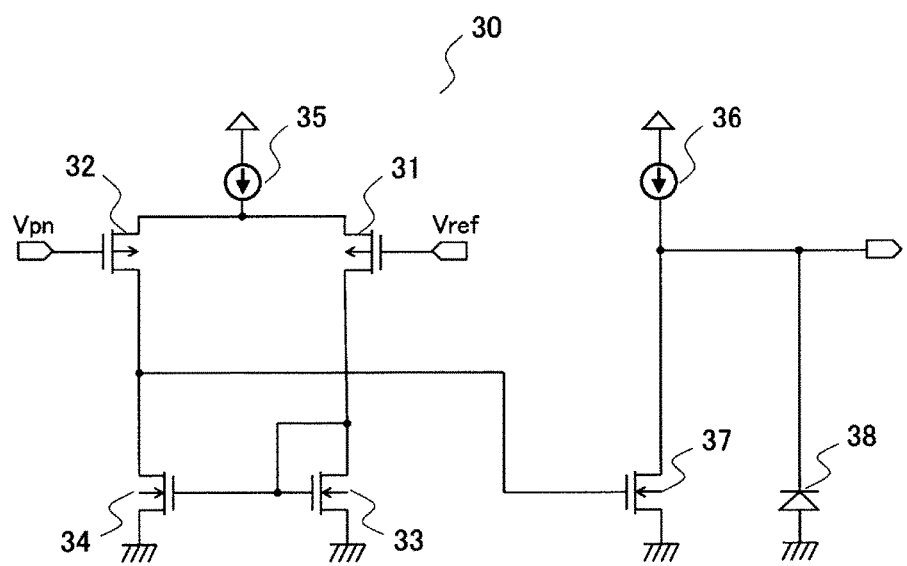
FIG. 2 is a circuit diagram of a comparator of the overheat detection circuit according to this embodiment.
Figure 3:
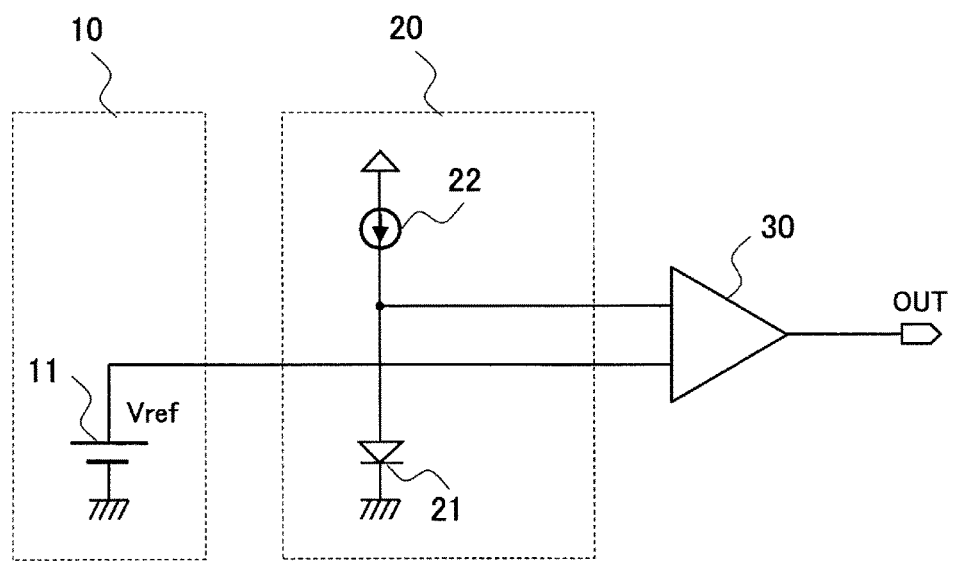
FIG. 3 is a circuit diagram of a related-art overheat detection circuit.

FIG. 2 is a circuit diagram of the comparator 30 of the overheat detection circuit according to this embodiment.

The comparator 30 includes PMOS transistors 31 and 32, NMOS transistors 33, 34, and 37, constant current circuits 35 and 36, and a PN junction element 38. The PMOS transistors 31 and 32, the NMOS transistors 33 and 34, and the constant current circuit 35 form a first stage amplifier. The NMOS transistor 37 and the constant current circuit 36 form a second stage amplifier. The PN junction element 38 is an element configured to cause a leakage current to flow at high temperature, thereby pulling down an output terminal of the comparator 30.

The first stage amplifier has differential inputs connected to input terminals of the comparator and an output terminal connected to a gate of the NMOS transistor 37. The constant current circuit 36 and the NMOS transistor 37 are connected in series between the power supply terminal and the ground terminal, and the output terminal of the comparator 30 is connected to a node therebetween. The PN junction element 38 is connected between the ground terminal and the node of the constant current circuit 36 and the NMOS transistor 37.

The comparator 30 inputs the reference voltage Vref and the voltage Vpn, and outputs the comparison result to an output terminal OUT of the overheat detection circuit from the output terminal.

Next, the operation of the overheat detection circuit of this embodiment is described.

The PN junction element 21, being a temperature sensitive element, generates the voltage Vpn corresponding to temperature. The comparator 30 compares and determines the reference voltage Vref output from the reference voltage circuit 11 and the voltage Vpn, to thereby detect an overheated state.

Because the PN junction element 21 is biased by the constant current of the constant current circuit 22, the voltage Vpn exhibits negative temperature characteristics. Therefore, the voltage Vpn is decreased when an ambient temperature becomes higher. The comparator 30 then outputs a signal L indicating the overheated state when the voltage Vpn falls below the reference voltage Vref.

In a case where the constant current circuit 22 includes a current mirror circuit formed of PMOS transistors, a leakage current is generated between a drain terminal of the PMOS transistor and a substrate to increase the current when the temperature becomes higher. Therefore, the bias current of the PN junction element 21 is increased, with the result that the voltage Vpn becomes higher than a desired value. In other words, the overheat detection circuit cannot detect the overheat at a predetermined temperature.

In this case, in the overheat detection circuit of this embodiment, the PN junction element 23 is connected to the node of the constant current circuit 22 and the PN junction element 21. The PN junction element 23 is connected so that, when the temperature becomes higher, a current leaking therethrough is increased to cause a leakage current of the constant current circuit 22 to flow to the ground terminal. Therefore, the bias current of the PN junction element 21 can be prevented from being increased when the temperature becomes higher, and hence the voltage Vpn has a desired value. In other words, the overheat detection circuit can detect the overheat at a predetermined temperature.

Moreover, a leakage current between a drain terminal of a saturation-connected NMOS transistor of the reference voltage circuit 11 and a substrate is increased, with the result that the reference voltage Vref falls below a desired value. In other words, the overheat detection circuit cannot detect the overheat at a predetermined temperature.

In this case, in the overheat detection circuit of this embodiment, the PN junction element 12 is connected between the power supply terminal and the reference voltage circuit 11. The PN junction element 12 is connected so that a current leaking therethrough is increased to cause the leakage current to flow through the reference voltage circuit 11 when the temperature becomes higher.

In a case where, for example, the saturation-connected NMOS transistor is biased by a constant current to generate the reference voltage Vref, the leakage current of the PN junction element 12 flows into the saturation-connected NMOS transistor, and hence the reference voltage Vref has a desired value at high temperature. In other words, the overheat detection circuit can detect the overheat at a predetermined temperature.

Moreover, a leakage current of a transistor forming the comparator 30 is increased to adversely affect an internal operating point, with the result that neither of the detection of the temperature nor the output of the detection result can be accurately performed.

In this case, in the overheat detection circuit of this embodiment, the PN junction element 38 is connected inside the comparator 30 between the output terminal and the ground terminal. The PN junction element 38 is designed so that a current leaking therethrough is increased to be larger than the current of the constant current circuit 36 when the temperature becomes higher.

For example, when the leakage current of the PN junction element 38 becomes larger than the current of the constant current circuit 36 near a temperature at which the overheat detection needs to be performed, the comparator 30 outputs the signal L from the output terminal regardless of whether the NMOS transistor 37 is turned on or off. In other words, the overheat detection circuit can output a signal indicating that the overheat is detected near the temperature at which the overheat detection needs to be performed. The overheat detection circuit designed as described above does not output an erroneous detection result.

As described above, the overheat detection circuit of this embodiment accurately detects a temperature of a semiconductor device even at high temperature and thus avoids outputting an erroneous detection result.

What is claimed is:

1. An overheat detection circuit, comprising:
   a PN junction element, being a temperature sensitive element;
   a constant current circuit configured to supply the PN junction element with a bias current;
   a reference voltage circuit configured to output a reference voltage;
   a comparator configured to compare a voltage generated at the PN junction element and the reference voltage;
   a second PN junction element configured to cause a leakage current to flow through the reference voltage circuit at high temperature; and
   a third PN junction element configured to bypass a leakage current of the constant current circuit at the high temperature,
   wherein the comparator includes a fourth PN junction element configured to cause a leakage current flowing therethrough to flow at the high temperature.

2. An overheat detection circuit according to claim 1, wherein the comparator comprises:
   a differential amplifier circuit configured to input the voltage generated at the PN junction element and the reference voltage;
   a MOS transistor having a gate to which an output of the differential amplifier circuit is input;
   a second constant current circuit connected to a drain of the MOS transistor; and
   wherein the fourth PN junction element is connected to the second constant current circuit and a node of the MOS transistor and the second constant current circuit serves as an output terminal of the comparator.

3. A semiconductor device, comprising the overheat detection circuit according to claim 1.

4. A semiconductor device, comprising the overheat detection circuit according to claim 2.

* * * * *